(12) United States Patent  
Johnson

(10) Patent No.: US 7,795,934 B2  
(45) Date of Patent: Sep. 14, 2010

(54) SWITCHED CAPACITOR FOR A TUNABLE DELAY CIRCUIT

(75) Inventor: Gary M. Johnson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 79 days.

(21) Appl. No.: 10/733,605

(22) Filed: Dec. 11, 2003

(65) Prior Publication Data

US 2005/0127963 A1 Jun. 16, 2005

(51) Int. Cl.  
*H03L 7/06* (2006.01)

(52) U.S. Cl. .................. 327/158; 327/156; 327/149

(58) Field of Classification Search ......... 327/156–159, 327/147–150  
See application file for complete search history.

(56) References Cited

U.S. PATENT DOCUMENTS

| | | | | |
|---|---|---|---|---|
| 5,051,630 A * | 9/1991 | Kogan et al. | | 327/262 |
| 5,101,117 A * | 3/1992 | Johnson et al. | | 327/149 |
| 5,604,775 A | 2/1997 | Saitoh et al. | | 375/376 |
| 5,731,725 A | 3/1998 | Rothenberger et al. | | 327/262 |
| 5,831,929 A * | 11/1998 | Manning | | 365/233 |
| 6,150,862 A | 11/2000 | Vikinski | | 327/262 |
| 6,242,954 B1 | 6/2001 | Taniguchi et al. | | 327/149 |
| 6,259,330 B1 * | 7/2001 | Arai | | 331/57 |
| 6,323,705 B1 * | 11/2001 | Shieh et al. | | 327/158 |
| 6,327,318 B1 * | 12/2001 | Bhullar et al. | | 375/374 |
| 6,388,485 B2 | 5/2002 | Kim | | 327/161 |
| 6,417,706 B2 * | 7/2002 | Kondo | | 327/158 |
| 6,445,231 B1 * | 9/2002 | Baker et al. | | 327/158 |
| 6,483,359 B2 * | 11/2002 | Lee | | 327/158 |
| 6,621,315 B2 * | 9/2003 | Heo et al. | | 327/158 |
| 6,683,928 B2 | 1/2004 | Bhullar et al. | | 375/374 |
| 6,700,434 B2 * | 3/2004 | Fujii et al. | | 327/534 |
| 6,728,163 B2 * | 4/2004 | Gomm et al. | | 365/233 |
| 6,836,166 B2 * | 12/2004 | Lin et al. | | 327/158 |
| 6,950,487 B2 | 9/2005 | Lin et al. | | 375/376 |
| 7,518,422 B2 * | 4/2009 | Johnson | | 327/158 |

* cited by examiner

*Primary Examiner*—Dinh T. Le  
(74) *Attorney, Agent, or Firm*—Dorsey & Whitney LLP

(57) ABSTRACT

A method and apparatus is provided for providing a fine delay by switching on a capacitor delay. A coarse delay and/or a fine delay are implemented upon a reference signal based upon a phase shift between the reference signal and a feedback signal. A fine delay is implemented upon the reference signal based upon a phase shift between the reference signal and a feedback signal. Providing the fine delay includes switching on a capacitive delay. A synchronized output signal is generated based upon the fine delay.

23 Claims, 5 Drawing Sheets

SWITCHED CAPACITOR FOR A TUNABLE DELAY CIRCUIT

BACKGROUND OF THE INVENTION

1. Field of the Invention

This invention relates generally to a semiconductor memory device, and, more specifically, to providing an efficient capacitance switching for a tunable delay circuit.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256K ($2^{18}$) memory cells.

Flash memory (sometimes called "flash RAM") is a type of non-volatile memory that can be erased and reprogrammed in units of memory called blocks. Other types of memory may be erased and rewritten in smaller units, such as units at the byte level, which is more flexible, but slower than the block operations of flash memory. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices.

Typically, digital systems, such as memory systems, may comprise a delay lock loop that may be used to align the edges of a plurality of digital signals. For example, a delay lock loop circuit may be used to align the rising edge and/or the falling edge of a clock signal based upon a reference clock signal, to produce a synchronized clock signal. Many times, digital signals from multiple sources access one or more memory spaces in a memory unit. It is desirable that these digital signals be synchronized for proper access of memory. Typical delay lock loops comprise a phase detect unit that detects the phase differences between a plurality of signals. The output of the phase detect unit is then used to affect the operation of a filter that adjusts the delay of an output of the delay lock loop.

The problems associated with the current methodologies of implementing the delay lock loop include an overreaction when performing delay compensation due to external factors on a digital line. Among the problems associated with current methodologies include utilizing multiplexers to control a number of capacitances, which are used to implement capacitive delays, to compensate for delay in the delay lock loop circuitry. However, the utilization of multiplexers to control the capacitors may cause various problems because of the inherent electrical characteristics of the capacitors and the resistance of the multiplexers. For example, multiplexers that are used to control the addition or elimination of capacitances (i.e., capacitive delays) to acquire the desired delay may be affected by its inherent resistivity. The resistance of the multiplexers may isolate capacitances from other components in a delay lock loop. Furthermore, the resistivity of the capacitance affects the RC time constant of the entire circuit in the delay lock loop, which may be affected by process, temperature or voltage variations. In other words, the time constant associated with the resistivity of the multiplexer and the capacitances used for the delay may be adversely affected by external factors, such as temperature, voltage or manufacturing processes. It would be desirable to implement a solution that may reduce the dependence on the aforementioned resistivity, thereby reducing the dependency on temperature, voltage or processes associated with a particular device.

The present invention is directed to overcoming, or at least reducing, the effects of, one or more of the problems set forth above.

SUMMARY OF THE INVENTION

In one aspect of the instant invention, a device is provided to perform switching of capacitance in a delay lock loop. The device of the present invention includes a delay lock loop to provide an output signal based upon a phase difference between a reference signal and a feedback signal. The delay lock loop includes a delay circuit for switching an activation of a capacitive delay.

In another aspect of the instant invention, a delay lock loop is provided to perform switching of capacitance in a delay lock loop. The delay lock loop of the present invention includes a reference signal and a feedback signal. The delay lock loop also includes a coarse delay unit to provide said coarse delay upon the reference signal or a data output signal. The delay lock loop also includes a fine delay unit for switching an activation of a capacitive delay to provide a fine tuned delay upon the reference signal or said data output signal. The delay lock loop also includes a phase detector to recognize said phase difference between the reference signal and the feedback signal. The delay lock loop also includes a feedback delay unit to provide a delay upon said output signal to generate said feedback signal.

In another aspect of the instant invention, a circuit is provided to perform switching of capacitance in a delay lock loop. The circuit includes a coarse delay unit to provide a coarse delay upon a reference signal or a data output signal. The circuit also includes a fine delay unit for switching an activation of a capacitive delay to provide a fine tuned delay upon reference signal or the data output signal. The circuit also includes a phase detector to recognize a phase difference between the reference signal and a feedback signal. The circuit also includes a feedback delay unit to provide a delay upon said output signal to generate said feedback signal.

In yet another aspect of the instant invention, a system board is provided to perform switching of capacitance in a delay lock loop. The system board of the present invention comprises a first device and a second device. The first device includes a memory location for storing data and a delay lock loop to provide an output signal based upon a phase difference between a reference signal and a feedback signal. The delay lock loop includes a delay circuit for switching an activation of a capacitive delay.

In yet another aspect of the instant invention, a memory device, which is capable of performing switching of capacitance in a delay lock loop, is provided. The memory device of the present invention includes a delay lock loop to provide an output signal based upon a phase difference between a reference signal and a feedback signal. The delay lock loop includes a delay circuit for switching an activation of a capacitive delay.

In another aspect of the instant invention, a method is provided for performing switching of capacitance in a delay lock loop. A coarse delay and/or a fine delay are implemented upon a reference signal based upon a phase shift between the reference signal and a feedback signal. A fine delay is implemented upon the reference signal based upon a phase shift between the reference signal and a feedback signal. Providing the fine delay includes switching on a capacitive delay. A synchronized output signal is generated based upon the fine delay.

BRIEF DESCRIPTION OF THE DRAWINGS

The invention may be understood by reference to the following description taken in conjunction with the accompanying drawings, in which like reference numerals identify like elements, and in which.

Figure 1:
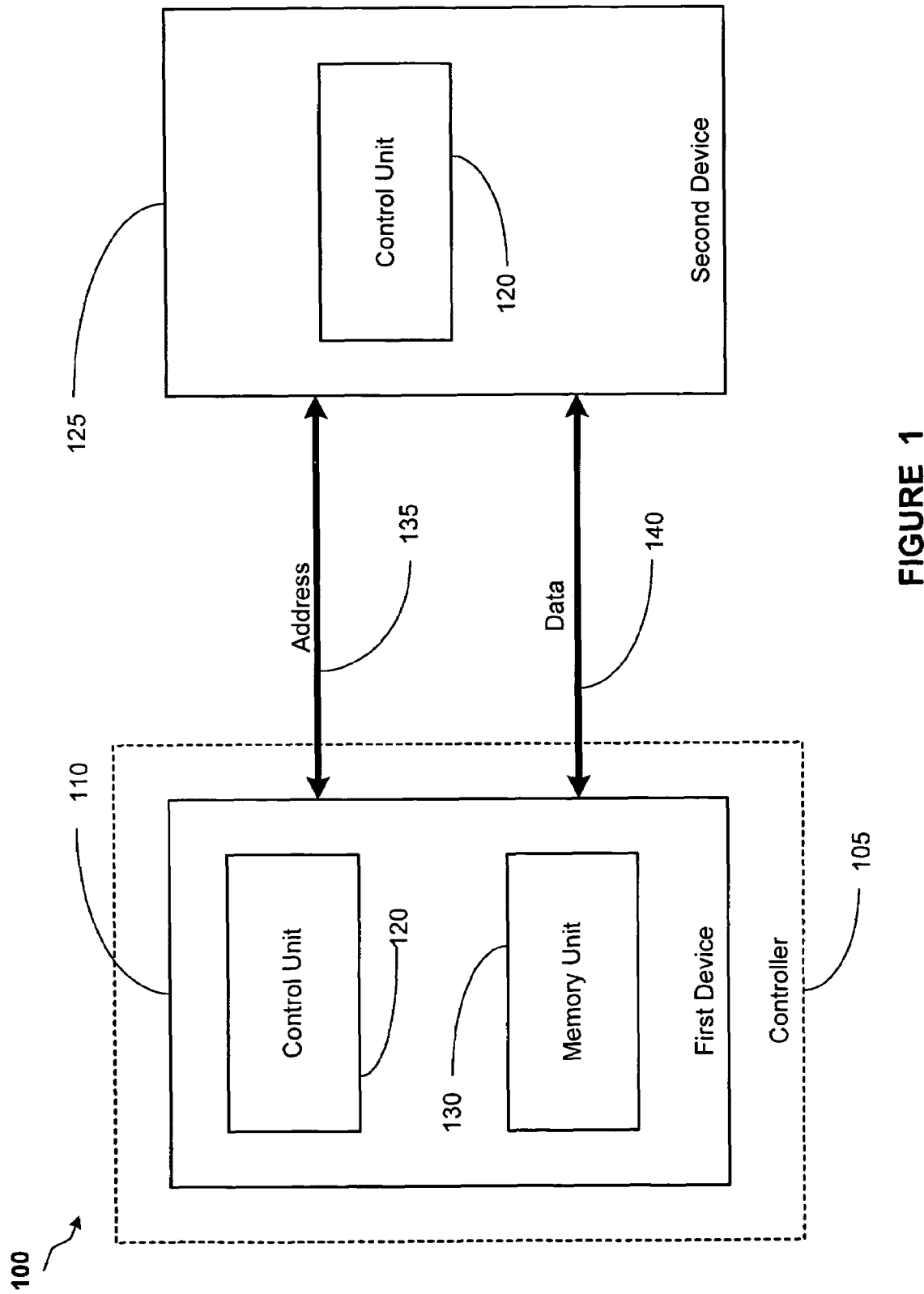
FIG. 1 is a block diagram of a system including a device that is capable of accessing digital signals, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Synchronization between multiple digital signals in a digital system is important for accurate exchange of digital data. Often, delay lock loops are employed to synchronize digital signals. However, without proper fine-tuning of delays to synchronize digital signals, the delay lock loop may cause overreaction to external factors, such as temperature, operation voltage, and/or manufacturing processes. This overreaction may compromise the accuracy of the performance of the delay lock loop. Embodiments of the present invention provide for implementing a delay, such as a fine tuned delay (fine delay) in a delay lock loop circuitry to provide more synchronized transmission of signals in and/or out of an electronic device, such as a memory device.

Embodiments of the present invention provide for implementing capacitive delays in a fine delay environment in a delay lock loop circuit. A novel implementation of adding or deleting capacitances used for delays is provided. For example, direct control of additions or deletions of capacitances may be implemented, thereby reducing the need for a multiplexer to implement or exclude capacitive delays. Therefore, the resistive interferences caused by the multiplexer, such as modification of the RC time constant caused by the resistivity of the multiplexer, is reduced. Hence, implementing embodiments of the present invention provides for performing fine tune delays using capacitances and reducing the effect of resistivity from multiplexers, thereby resulting in more accurate delays. These delays are then used to synchronize various digital signals.

Referring to FIG. 1, a block diagram of a system 100 is illustrated, in accordance with one embodiment of the present invention. The system 100 comprises a first device 110, which, in one embodiment, may comprise a memory unit 130 capable of storing data. In one embodiment, the memory unit 130 may be a dynamic random access memory (DRAM), a static random access memory (SRAM), a double-data rate synchronous DRAM (DDR SDRAM, DDR I, DDR II), a Rambus™ DRAM (RDRAM), a FLASH memory unit, or the like. The first device 110 may be encompassed by a controller 105. In one embodiment, the controller 105 may be a memory controller, a computer system, such as a PC-computer, and the like. In one embodiment, the controller 105 may be a system board, such as a motherboard for a computer system. The first device 110 may be accessed by a second device 125, which, in one embodiment, may be an accessing/access device. The second device 125 may send addresses on a line 135 to the first device 110. The first device 110 may then provide data to the second device 125 on a line 140. The first and second devices 110, 125 may comprise a control unit 120 capable of accessing data (including code) stored in the memory unit 130 of the first device 110. The second device 125 may be any device that uses the first device 110 to store data, read data, or both. Examples of the second device 125 may include, but are not limited to, a computer, a camera, a telephone, a television, a radio, a calculator, a personal digital assistant, a network switch, and the like.

The control unit 120, in one embodiment, may manage the overall operations of the second device 125, including writing and reading data to and from the first device 110. The control unit 120 may comprise a microprocessor, a microcontroller, a digital signal processor, a processor card (including one or more microprocessors or controllers), a memory controller, or other control or computing devices.

In one embodiment, the first device 110 may be a memory chip device, such as a DRAM device, an SRAM device, a FLASH memory device, and the like. In one embodiment, the first device 110 may be a memory chip device that may be implemented into a digital system, such as a computer system. In an alternative embodiment, the first device 110 may be an external memory, such as a memory stick, and may be accessed when inserted into a slot (not shown) of the second device 125. When inserted into the slot, the second device 125 may provide the appropriate power and control signals to access memory locations in the first device 110. The first device 110 may be external to, or internal (e.g., integrated) to, the second device 125. The second device 125, which may be a computer system, may employ a first device 110 (in the form of a memory unit) that is integrated within the computer system to store data (e.g., BIOS [basic input/output system]) related to the computer system.

Figure 2:
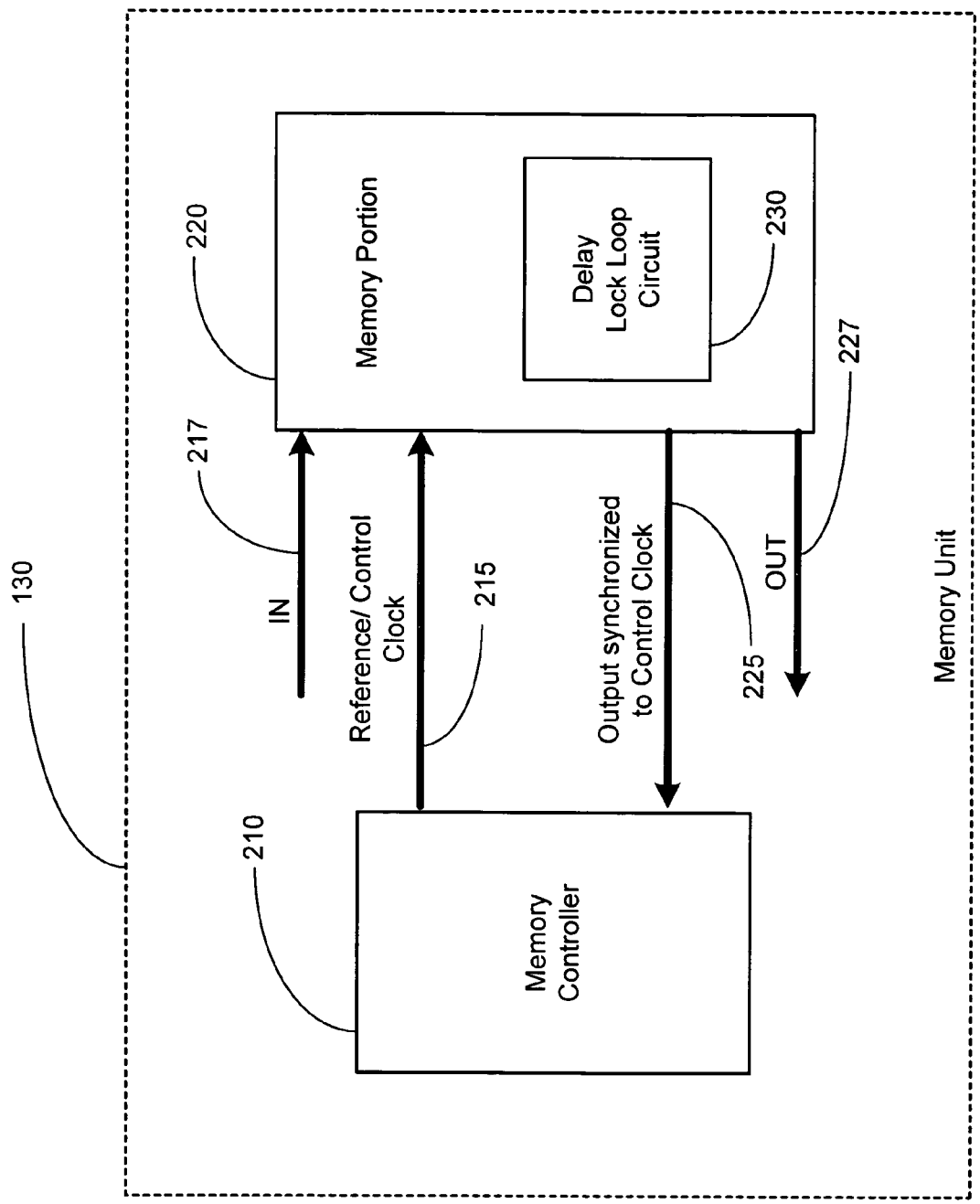
FIG. 2 is a more detailed block diagram representation of the memory unit of FIG. 1, in accordance with one illustrative embodiment of the present invention.

Turning now to FIG. 2, a more detailed block diagram depiction of the memory unit 130 in accordance with one illustrative embodiment of the present invention is provided. In one embodiment, the memory unit 130 comprises a memory controller 210, which is operatively coupled to one or more memory devices 220. The memory controller 210 may comprise circuitry that provides access (e.g., such as storing and extracting data to and from the memory devices 220) to control operations of the memory unit 130. The memory portion 220 may be an array of memory storing modules that are capable of storing data.

Proper timing of the data signals carrying data from the memory portion 220 is useful in extracting data accurately. For example, if the period of the control clock is 5 nanoseconds, and the data is to be sent or received on every clock edge of the control clock 215 (e.g., as in the case of a double data rate [DDR SDRAM]) then there is a 2.5 nanosecond maximum timing window available to send or receive the data. Therefore, a delay lock loop may be employed to synchronize various digital signals (e.g., operation clocks, data signals, etc.) to ensure that data access is performed within acceptable timing windows. The memory portion 220 may receive an input signal IN on the line 217, which may contain data and/or control signals. The memory portion 220 may also provide an output signal OUT on the line 227, which may contain data and/or status signals. For example the IN signal on the line 217 may contain data to be written into the memory portion 220. As another example, the OUT signal on the line 227 may comprise data that is being output from the memory portion 220. The IN signal (on the line 217) and the OUT signal (on the line 227) may be delayed and synchronized to the reference clock/control signal on the line 215.

In one embodiment, the memory portion 220 may comprise a delay lock loop circuit 230. In alternative embodiments, the delay lock loop circuit 230 may reside in other portions of the memory unit 130, such as in the memory controller 210. The delay lock loop circuit 230 is capable of locking a plurality of digital signals based upon a reference or a control clock on a line 215. A delay generated by the delay lock loop circuit 230 may be used to synchronize the output signal carrying data from the memory portion 220 to an external clock, such as a control clock derived from a system clock. The memory portion 220 is capable of providing one or more output signals to the memory controller 210 based upon a reference or control clock on a line 215 received by the memory portion 220. The reference/control clock may be generated by the memory controller 210 and/or from a component external to the memory unit 130, such as the control unit 120.

In one embodiment, the memory portion 220 receives a control clock on a line 215 from the memory controller 210. The delay lock loop circuit 230 is capable of utilizing the control clock on the line 215 and providing an output synchronized to the control clock on a line 225. The memory controller 210 may use the output that is synchronized to the control clock on the line 215 to supply data to outside sources, such as the second device 125 and/or various components associated with the first device 110. Improvements in delay lock loop synchronization of digital signals may result in more accurate and efficient storing and/or extraction of data to and from the memory portion 220. The delay lock loop circuit 230 is capable of aligning the input edges and/or the output edges of various digital signals based upon the control clock on the line 215. The delay lock loop circuit 230 is capable of performing a phase detect function based upon the control clock on the line 215, creating a feedback loop to lock the edges of a plurality of digital signals. Using the delay lock loop circuit 230, multiple signals may be synchronized for effective and accurate transmission of data.

Figure 3:
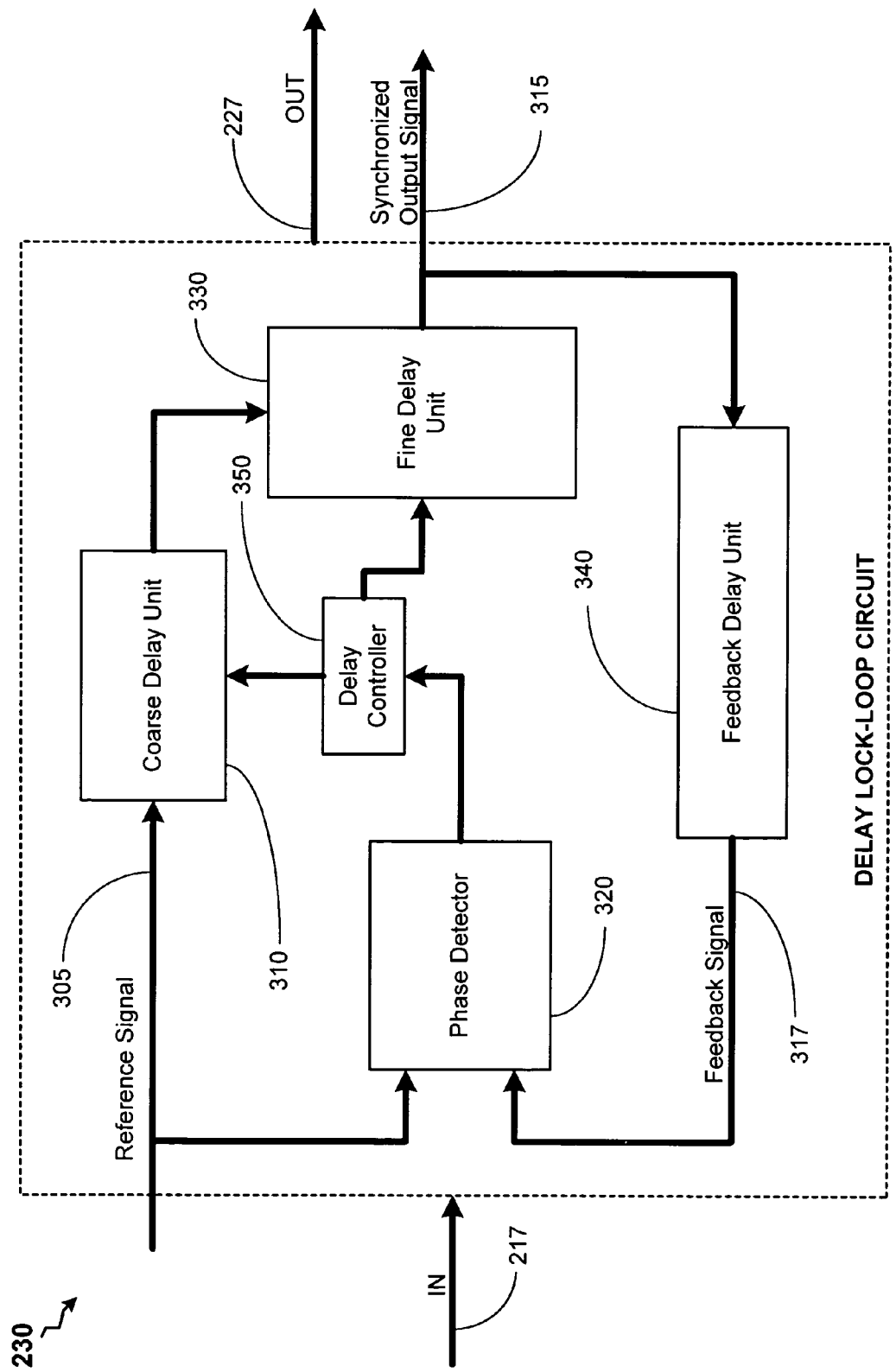
FIG. 3 illustrates a block diagram representation of a delay lock loop circuit of FIG. 2, in accordance with one illustrative embodiment of the present invention.

Turning now to FIG. 3, a more detailed description of the delay lock loop circuit 230 is illustrated. In one embodiment, the delay lock loop circuit 230 comprises a coarse delay unit 310, a feedback delay unit 340, a phase detector 320, a fine delay unit 330, and a delay controller 350. The coarse delay unit 310 provides a delay based upon a reference clock, which may be the control clock on the line 215. In one embodiment, the coarse delay unit 310 implements a coarse delay adjustment, as compared to a fine delay adjustment that is described below, onto the reference signal (e.g., a reference clock signal) on a line 305. The signal delayed by the coarse delay unit 310 is provided to the fine delay unit 330, which is described in more detail below. The fine delay unit 330 may then add or subtract additional delay and provide a synchronized digital output signal on a line 315. The coarse delay unit 310 may be capable of adding different delay components to a signal based upon independent control signals. The delay controller 350 may acquire phase delay signal(s) from the phase detector 320 and cause the coarse delay unit 310 and/or the fine delay unit 330 to better synchronize digital signals, such as the IN and OUT signals on the lines 217 and 227.

The feedback delay unit 340 provides a feedback delay for the phase detector 320 on a line 317. In one embodiment, the synchronized output signal on the line 315 is delayed by the feedback delay unit 340. The phase detector 320 detects a phase difference between the reference signal on the line 305 and the signal from the feedback delay unit 340 on the line 317. The phase detector 320 provides a signal that indicates the phase difference between the reference lock and the feedback clock on the line 317 to the fine delay unit 330. The fine delay unit 330 provides a delay signal to the coarse delay unit 310, which may be based upon an output from the phase detector 320 and/or a fine delay generated by the fine delay unit 330. The fine delay unit 330 may also generate the synchronized output signal on the line 315.

The output of the delay lock loop circuit 230 provides a synchronized output on the line 315 for providing synchronized extraction of data to and from the memory portion 220. Generally, the delay lock loop circuit 230 provides a first order control system that is generally stable and does not generally accumulate substantial phase error. The absence of significant phase error may be due to the elimination of a voltage control oscillator, which may cause jitter(s) in the resulting transfer function. Furthermore, as compared to a voltage control oscillator, the delay lock loop is generally not a frequency synthesizer and is typically more immune to noise.

In one embodiment, the fine delay unit 330 provides a qualified shift (an increase or decrease in delay) that is applied to the reference clock 215 by the coarse delay unit 310. In one embodiment, the fine delay unit 330 may be positioned after the implementation of the coarse delay unit 310. In an alternative embodiment, the fine delay unit 330 may be positioned before the implementation of the coarse delay unit 310. A more detailed illustration and description of the fine delay unit 330 is provided in FIG. 4 and accompanying description below.

Figure 4:
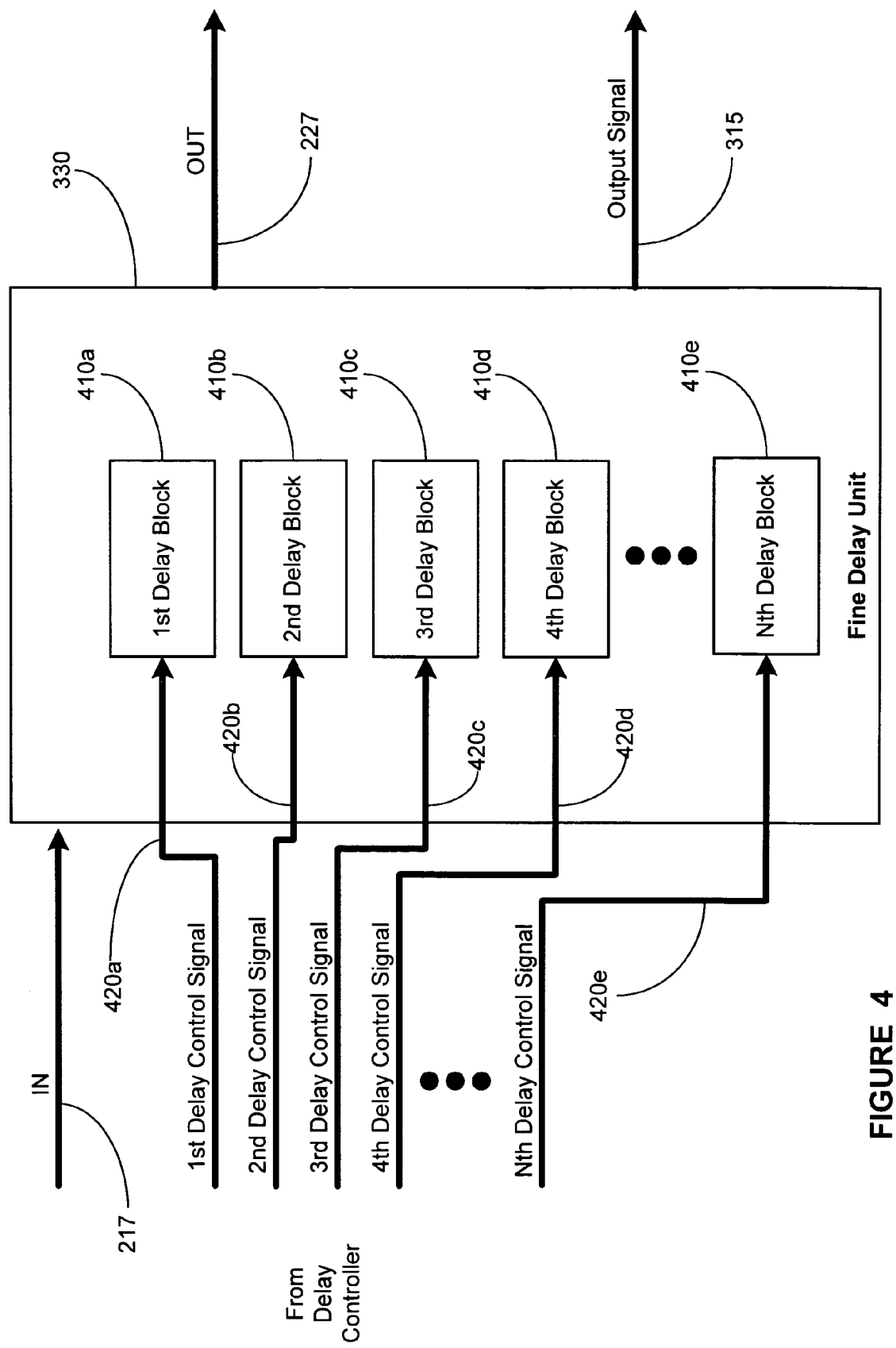
FIG. 4 is a more detailed block diagram representation of the fine delay unit of FIG. 3, in accordance with one illustrative embodiment of the present invention.

Turning now to FIG. 4, a block diagram illustration of an implementation of the fine delay unit 330, in accordance with one embodiment of the present invention, is illustrated. The fine tune delay unit 330 may comprise a plurality of delay blocks: a first delay block 410a; a second delay block 410b; a third delay block 410c; a fourth delay block 410d; and an $N^{th}$ delay block 410e. These individual delay blocks 410a-410e may be activated in order to reduce or increase the amount of fine tune delay provided by the fine tune delay unit 330. The delay blocks 410a-410e are controlled respectively by the first through Nth delay control signals 420a-420e. The delay controller 350 determines a delay needed based upon the phase difference signal received from the phase detector 320. The delay controller 350 determines the amount of delay to implement based upon a comparison of the reference signal and the feedback signal as described above.

The delay controller 350 makes a determination regarding the amount of fine delay to be implemented by the fine delay unit 330. Based upon such a determination, the delay controller 350 may assert one or more of the first through Nth delay control signals 420a-420e. In response to such an assertion, additional delays or capacitances may be implemented by activating one or more of the first through Nth delay blocks 410. Conversely, the delay controller 350 may de-assert one or more of the first through Nth delay control signals 420a-420e to reduce the capacitive delay(s) in the fine delay unit 330.

Based upon the fine delay provided by the fine delay unit 330, a synchronized output signal 315 is provided. The IN signal on the line 217 may be sent to the fine delay unit 330, which is then synchronized with the output signal 315 and the OUT signal on the line 227. Each of the first through the Nth delay blocks 410 may represent a certain amount of capacitance that is implemented in parallel. Since capacitances are added when they are implemented in parallel, the first delay block 410a may be activated along with the second delay block 410b in parallel to the first delay block 410a, thereby adding capacitance of the second delay block 410b to the capacitance of the first delay block 410a. Similarly, additional capacitances may be added by implementing one or more of the third through Nth delay blocks 410c-410e. The implementation of additional capacitances based upon the activation of the second through Nth delay blocks 410b-410e, is implemented without the use of a multiplexer. A more detailed description of the first through Nth delay blocks 410a-410e are illustrated in FIG. 5 and the accompanying description below.

Figure 5:
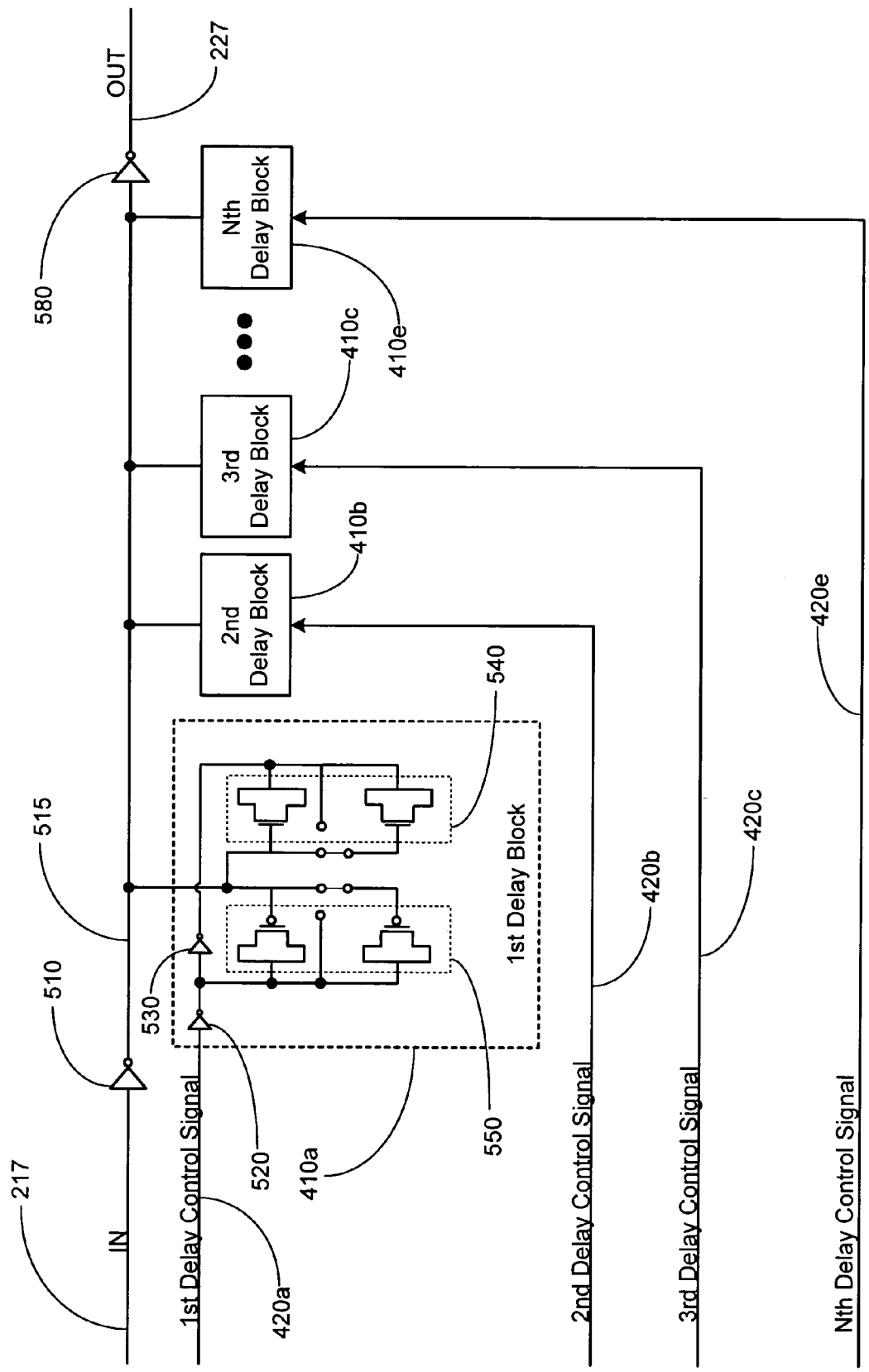
FIG. 5 illustrates a block diagram representation of a delay block of FIG. 4, in accordance with one illustrative embodiment of the present invention.

Turning now to FIG. 5, one embodiment of the implementation of the first through Nth delay blocks 410a-410e in accordance with embodiments of the present invention is illustrated. FIG. 5 illustrates the delay implemented by the first delay block 410a upon the IN signal. In the implementation illustrated in FIG. 5, only four delay blocks 410 are illustrated, however, those skilled in the art would appreciate that any number of delay blocks may be implemented to achieve a variety of delays. Therefore, the illustration in FIG. 5 illustrates only four delay blocks 410 in the interest of clarity, however, it does not limit any portion of the invention to the illustrated embodiments.

As illustrated in FIG. 5, the IN signal on the line 217 is subjected to a certain amount of delay, thereby providing a delayed, synchronized OUT signal on the line 227. In one embodiment, the illustrated fine delay unit 330 may be set at a default of having two of the four delay blocks 410a-410e implemented or active. Therefore, capacitances (i.e., delays) may be added or subtracted to fine tune the delay experienced by a signal. For example, the default settings for the first and second delay control signals 420a, 420b may be set at logic low. The third and the fourth delay control signals 420c, 420d may be set at logic level high. Therefore, adding or subtracting the delay may be implemented by changing the logic level of one or more of the first through fourth delay control signals 420a-420d. For example, if the first delay control signal 420a is logic low, and the second through fourth delay control signals 420a-420d are logic high, then one less capacitive delay is implemented, as compared to the default setting.

The IN signal on the line 217 experiences a first inverter 510, the output of which is also connected to an input terminal of a second inverter 580, whose output is the OUT signal on the line 227. The implementation of delays by activating one or more of the first through fourth delay blocks 410a-410d that are tied to the signal on a line 515, and will add or subtract capacitive delays experienced by the OUT signal on the line 227. When the first delay control signal 420a is low, the first delay block 410a is activated, thereby providing a delay upon line 515. The first delay block 410a comprises an N-channel transistor set 540, which comprises N-channel transistors that are tied together on their drain nodes and their source nodes. The first delay block 410a also comprises a P-channel transistor set 550, which comprises P-channel transistors that are tied together on their drain nodes and their source nodes.

The substrate of the N-channel transistor set 540, by default, is tied to ground, and the substrate of the P-channel transistor set 550, by default, is tied to $V_{CC}$. When the first delay control signal 420a is at logic low level, the drain and the source of the N-channel transistor set 540 is at ground voltage level. When the N-channel transistor set 540 is on, its channel region becomes inverted, therefore, it experiences a higher capacitance. Thus, when activated, the N-channel transistor set 540 takes on the role of a capacitor. If the first delay control signal 420a were at logic high voltage level, the drain of the N-channel transistor set 540 goes to logic high and the inverter 510 experiences a turned-off device because the N-channel transistor set 540 is off. Therefore, the output of the inverter 510 experiences a lower capacitance and hence, lowers the amount of delay. In other words, the signal 515 does not experience a delay caused by the first delay block 410 when the first delay control signal 420a is high.

The complement of the logic described above applies to the P-channel transistor set 550 in a complementary manner. In other words, when the first delay control signal 420a is high, the P-channel transistor set 550 is activated since it experiences the opposite logic level of the first delay control signal 420a due to an inverter 520. The N-channel transistor set 540 experiences the actual logic level of the first delay control signal 420a due to the presence of an inverter 530, which follows the inverter 520. Since capacitances are added in parallel, the implementation of the other delay blocks 410b-410e may be used to add additional delays onto the line 515, thereby adjusting the total delay experienced by the OUT signal on the line 227.

One of the reasons for implementing the P-channel and the N-channel transistor sets 540, 550, is because a certain portion of the voltage swing experienced by the circuit in the first delay block 410a is not zero. During the first half of the voltage swing, on the output of the inverter 510, the devices seen by the output of the first inverter 510 are actually off. Therefore, the P-channel transistor set 550 helps cover that range because it will be on during the first half of the voltage swing. However, the P-channel transistor set 550 will shut off once the output of the inverter 510 experiences a voltage level after the first half of the voltage swing. When the output of the first inverter 510 is low, whether or not there is a capacitor tied upon it, the output of the first inverter 510 will not experience a capacitance because it is off until the voltage swing reaches a certain swing level. If the drain and the source of the transistor sets 540, 550 are up to logic high, then the output of the first inverter 510 will not experience an N-channel capacitance (or will experience a relatively low N-channel capacitance), but it will experience a P-channel capacitance (due to the activation of the P-channel transistor set 550). Therefore, having both the P-channel and N-channel transistor sets 540, 550, will provide a relatively constant capacitance during voltage transitions. During the middle range of the transition experienced by the first inverter 510, the highest capacitance is provided by the delay blocks 410 because the P-channel and N-channel transistor sets 540, 550 are active at this time. This may be helpful since the middle range transition area is where the inverter function of the first inverter 510 starts to switch. Therefore, switching the voltage on the drain and the source of the P-channel and N-channel transistor sets 540, 550 provides the novelty of not having to implement a multiplexer to activate any of the delay blocks 410.

Utilizing embodiments of the present invention, capacitive delays may be added or subtracted based upon the assertion of the delay control signals 420 without having to implement multiplexers. Therefore, the problem caused by the resistivity of the multiplexer is reduced. Therefore, the delay provided by the fine delay unit 330 is made more independent of the temperature, voltage or voltage experienced by the device, as well as being more independent of the process that may have been used to create the device itself. Similar operations may be implemented in additional delay blocks 410 that may be added to the fine delay unit 330. Hence, delay may be added or removed by the fine delay unit 330 to maintain synchronized data flow despite variations in operating temperature, operating voltages, and/or processes used to manufacture an electronic device, such a memory device.

Utilizing embodiments of the present invention provides for a delay lock loop circuit 230, such that external factors experienced by a device using the delay lock loop circuit 230 are reduced. The delay lock loop circuit 230 described by embodiments of the present invention may be implemented in a variety of electronic circuits. Utilizing embodiments of the present invention, a qualified shift signal may be generated to implement more accurate delays to produce a synchronized output signal. Access to memory devices generally requires accurate digital signals to ensure that proper data is placed and/or retrieved to and from the memory. Utilizing embodiments of the present invention, a delay locked loop circuit 230 is provided such that a noise spike in the digital signals may not be tracked and thereby preventing the noise spike from disrupting the operation of the delay lock loop circuit 230. The present invention provides for improved access of memory resulting from the improved operation of the delay lock loop. The delay lock loop circuit 230 described by embodiments of the present invention may be implemented into a variety of electronic circuits. The teachings of the present invention may be implemented on a plurality of types of memory devices, such as flash memory, DRAM memory, and other volatile and/or non-volatile memory devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    a delay lock loop configured to provide an output signal based upon a phase difference between a reference signal and a feedback signal, said delay lock loop comprising:
    a coarse delay unit configured to provide a coarse delay upon at least one of said reference signal and a data output signal;
    a fine delay unit configured to provide a fine delay upon at least one of said reference signal and said data output signal, said fine delay unit comprising:
        a first inverter configured to invert an input signal;
        an N-channel transistor set operatively coupled to said first inverter, said N-channel transistor set comprising a first and a second N-channel transistor, wherein a source terminal of said first N-channel transistor is coupled to a source terminal of said second N-channel transistor and a drain terminal of said first N-channel transistor is coupled to a drain terminal of said second N-channel transistor;
        a P-channel transistor set comprising a first and a second P-channel transistor, wherein a source terminal of said first P-channel transistor is coupled to a source terminal of said second P-channel transistor and a drain terminal of said first P-channel transistor is coupled to a drain terminal of said second P-channel transistor; and
        a second inverter operatively coupled to said P-channel transistor, said second inverter configured to provide a complementary control signal for said P-channel transistor set;
    a phase detector configured to detect said phase difference; and
    a feedback delay unit operatively coupled to said coarse delay unit, said fine delay unit, and said phase detector, said feedback delay unit configured to provide a delay upon said output signal to generate said feedback signal.

2. The device of claim 1, wherein said device is a memory device.

3. The device of claim 2, wherein said memory device is at least one of a static random access memory (SRAM), a dynamic random access memory (DRAM), a double-data rate SDRAM (DDR SDRAM), a DDR I device, a DDR II device, a Rambus DRAM (RDRAM), and a FLASH memory.

4. The device of claim 1, wherein activation of at least one of said P-channel and said N-channel transistor sets provides a switching on of said capacitive delay upon said input signal to provide a delayed output signal.

5. The device of claim 1, wherein de-activation of at least one of said P-channel and said N-channel transistor sets provides a switching off of said capacitive delay upon said input signal to provide an output signal with less delay.

6. The device of claim 1, further comprising a plurality of N-channel transistor sets and P-channel transistor sets to provide additional delays upon said input signal to provide a delayed output signal.

7. The device of claim 1, wherein said output signal comprises said coarse delay and said fine delay.

8. The device of claim 1, wherein said reference signal is a clock signal.

9. A system board, comprising:
a first device comprising a memory location for storing data and a delay lock loop configured to provide an output signal based upon a phase difference between a reference signal and a feedback signal, the delay lock loop comprising:
a coarse delay unit configured to provide a coarse delay upon at least one of said reference signal and a data output signal;
a fine delay unit configured to provide a fine tuned delay upon at least one of said reference signal and said data output signal, said fine delay unit comprising:
a first inverter to invert an input signal;
an N-channel transistor set operatively coupled to said first inverter, said N-channel transistor set comprising a first and a second N-channel transistor, wherein a source terminal of said first N-channel transistor is coupled to a source terminal of said second N-channel transistor and a drain terminal of said first N-channel transistor is coupled to a drain terminal of said second N-channel transistor;
a P-channel transistor set comprising a first and a second P-channel transistor, wherein a source terminal of said first P-channel transistor is coupled to a source terminal of said second P-channel transistor and a drain terminal of said first P-channel transistor is coupled to a drain terminal of said second P-channel transistor; and
a second inverter operatively coupled to said P-channel transistor, said second inverter configured to provide a complementary control signal for said P-channel transistor set;
a phase detector configured to detect said phase difference; and
a feedback delay unit operatively coupled to said coarse delay unit, said fine delay unit, and said phase detector, said feedback delay unit configured to provide a delay upon said output signal to generate said feedback signal; and
a second device operatively coupled to said first device, said second device configured to access said data from said first device based upon an operation performed by said delay lock loop.

10. The system board described in claim 9, wherein said memory location is at least one of an SRAM, a DRAM, a DDR SDRAM, a DDR I device, a DDR II device, a RDRAM, and a FLASH memory.

11. The system board of claim 9, wherein said system board is a motherboard of a computer system.

12. The system board of claim 9, wherein activation of at least one of said P-channel and said N-channel transistor sets provides switches on a capacitive delay upon said input signal to provide a delayed output signal.

13. The system board of claim 9, wherein de-activation of at least one of said P-channel and said N-channel transistor sets switches off capacitive delay upon said input signal to provide an output signal with less delay.

14. The system board of claim 9, further comprising a plurality of N-channel transistor sets and P-channel transistor sets to provide additional delays upon said input signal to provide a delayed output signal.

15. The system board of claim 9, wherein said output signal comprises said coarse delay and said fine delay.

16. The system board of claim 9, wherein said reference signal is a clock signal.

17. A memory device, comprising:
a delay lock loop configured to provide an output signal based upon a phase difference between a reference signal and a feedback signal, said delay lock loop comprising:
a coarse delay unit configured to provide a coarse delay upon at least one of said reference signal and a data output signal;
a fine delay unit configured to provide a fine tuned delay upon at least one of said reference signal and said data output signal, said fine delay unit comprising:
a first inverter configured to invert an input signal;
an N-channel transistor set comprising a first and a second N-channel transistor, wherein a source terminal of said first N-channel transistor is coupled to a source terminal of said second N-channel transistor and a drain terminal of said first N-channel transistor is coupled to a drain terminal of said second N-channel transistor;
a P-channel transistor set comprising a first and a second P-channel transistor, wherein a source terminal of said first P-channel transistor is coupled to a source terminal of said second P-channel transistor and a drain terminal of said first P-channel transistor is coupled to a drain terminal of said second P-channel transistor; and
a second inverter configured to provide a complementary control signal for said P-channel transistor set;
a phase detector configured to detect said phase difference; and
a feedback delay unit operatively coupled to said coarse delay unit, said fine delay unit, and said phase detector, said feedback delay unit configured to provide a delay upon said output signal to generate said feedback signal.

18. The memory device of claim 17, wherein said memory device is at least one of a static random access memory (SRAM), a dynamic random access memory (DRAM), a double-data rate SDRAM (DDR SDRAM), a DDR I device, a DDR II device, a Rambus DRAM (RDRAM), and a FLASH memory.

19. The memory device of claim 18, wherein activation of at least one of said P-channel and said N-channel transistor sets provides a switching on of a capacitive delay upon said input signal to provide a delayed output signal.

20. The memory device of claim 18, wherein de-activation of at least one of said P-channel and said N-channel transistor sets provides a switching off of a capacitive delay upon said input signal to provide an output signal with less delay.

21. The memory device of claim 18, further comprising a plurality of N-channel transistor sets and P-channel transistor sets configured to provide additional delays upon said input signal to provide a delayed output signal.

22. The memory device of claim 18, wherein said output signal comprises said coarse delay and said fine delay.

23. The device of claim 22, wherein said reference signal is a clock signal.

* * * * *

UNITED STATES PATENT AND TRADEMARK OFFICE
CERTIFICATE OF CORRECTION

| | | |
|---|---|---|
| PATENT NO. | : 7,795,934 B2 | Page 1 of 1 |
| APPLICATION NO. | : 10/733605 | |
| DATED | : September 14, 2010 | |
| INVENTOR(S) | : Gary M. Johnson | |

It is certified that error appears in the above-identified patent and that said Letters Patent is hereby corrected as shown below:

In column 11, line 58, in Claim 13, after "off" insert -- a --.

In column 12, line 46, in Claim 19, delete "claim 18," and insert -- claim 17, --, therefor.

In column 12, line 50, in Claim 20, delete "claim 18," and insert -- claim 17, --, therefor.

In column 12, line 54, in Claim 21, delete "claim 18," and insert -- claim 17, --, therefor.

In column 12, line 58, in Claim 22, delete "claim 18," and insert -- claim 17, --, therefor.

Signed and Sealed this
Second Day of October, 2012

David J. Kappos
*Director of the United States Patent and Trademark Office*